(12) United States Patent
Drew

(10) Patent No.: US 10,368,453 B2
(45) Date of Patent: Jul. 30, 2019

(54) HOUSING FOR RECEIVING ELECTRICAL AND/OR ELECTRONIC COMPONENTS, ELECTRONIC CONTROL UNIT AND METHOD FOR PRODUCING SAME

(71) Applicant: CONTINENTAL AUTOMOTIVE GMBH, Hannover (DE)

(72) Inventor: Gregory Drew, Zeitlarn (DE)

(73) Assignee: Continental Automotive GmbH, Hannover (DE)

( * ) Notice: Subject to any disclaimer, the term of this patent is extended or adjusted under 35 U.S.C. 154(b) by 66 days.

(21) Appl. No.: 15/511,670

(22) PCT Filed: Sep. 14, 2015

(86) PCT No.: PCT/EP2015/070963
§ 371 (c)(1),
(2) Date: Mar. 16, 2017

(87) PCT Pub. No.: WO2016/041904
PCT Pub. Date: Mar. 24, 2016

(65) Prior Publication Data
US 2017/0311458 A1    Oct. 26, 2017

(30) Foreign Application Priority Data
Sep. 16, 2014   (DE) .......................... 10 2014 218 528

(51) Int. Cl.
*H05K 5/00*   (2006.01)
*H05K 5/06*   (2006.01)
*H05K 7/14*   (2006.01)

(52) U.S. Cl.
CPC ........... *H05K 5/0052* (2013.01); *H05K 5/006* (2013.01); *H05K 5/069* (2013.01); *H05K 7/142* (2013.01)

(58) Field of Classification Search
CPC ...... H05K 5/0052; H05K 5/006; H05K 5/069; H05K 7/142
See application file for complete search history.

(56) References Cited

U.S. PATENT DOCUMENTS

| | | |
|---|---|---|
| 6,215,667 B1 | 4/2001 | Ady et al. |
| 6,535,394 B1 | 3/2003 | Hirzmann |
| 6,843,405 B2 | 1/2005 | Okamoto et al. |
| 7,798,757 B2 | 9/2010 | Kawano et al. |
| 10,182,858 B2 | 1/2019 | Hassler, Jr. |

(Continued)

FOREIGN PATENT DOCUMENTS

| | | |
|---|---|---|
| CN | 1910015 A | 2/2007 |
| CN | 101025180 A | 8/2007 |

(Continued)

*Primary Examiner* — Nidhi Thaker
(74) *Attorney, Agent, or Firm* — Laurence A. Greenberg; Werner H. Stemer; Ralph E. Locher

(57) ABSTRACT

A housing for receiving electrical and/or electronic components includes a housing base part and a housing cover which covers the housing base part and which is supported on the housing base part and/or fastened to the housing base part at least by a spacer bolt. The housing cover has an opening. The spacer bolt is integrally or substance bonded to an edge of the opening and the spacer bolt closes the opening. An electronic control unit and a method for producing the housing or the control unit are also provided.

14 Claims, 3 Drawing Sheets

(56) References Cited

U.S. PATENT DOCUMENTS

| | | | | |
|---|---|---|---|---|
| 2007/0109730 A1* | 5/2007 | Shigyo | .................. | H05K 5/0052 361/600 |
| 2011/0228451 A1* | 9/2011 | Chiu | .................... | F16B 35/041 361/679.01 |
| 2012/0069532 A1* | 3/2012 | Azumi | .................. | H05K 5/0052 361/752 |
| 2012/0320544 A1* | 12/2012 | Ohhashi | ............... | H05K 5/0052 361/752 |
| 2013/0289565 A1* | 10/2013 | Hassler, Jr. | ........ | A61B 17/1626 606/79 |
| 2014/0334123 A1* | 11/2014 | Grossman | ............ | H05K 9/0007 361/818 |

FOREIGN PATENT DOCUMENTS

| | | |
|---|---|---|
| CN | 103379867 A | 10/2013 |
| DE | 9110871 U1 | 12/1991 |
| DE | 9201024 U1 | 5/1992 |
| DE | 19719942 A1 | 12/1998 |
| EP | 1400302 A1 | 3/2004 |
| JP | 2004106037 A | 4/2004 |

\* cited by examiner

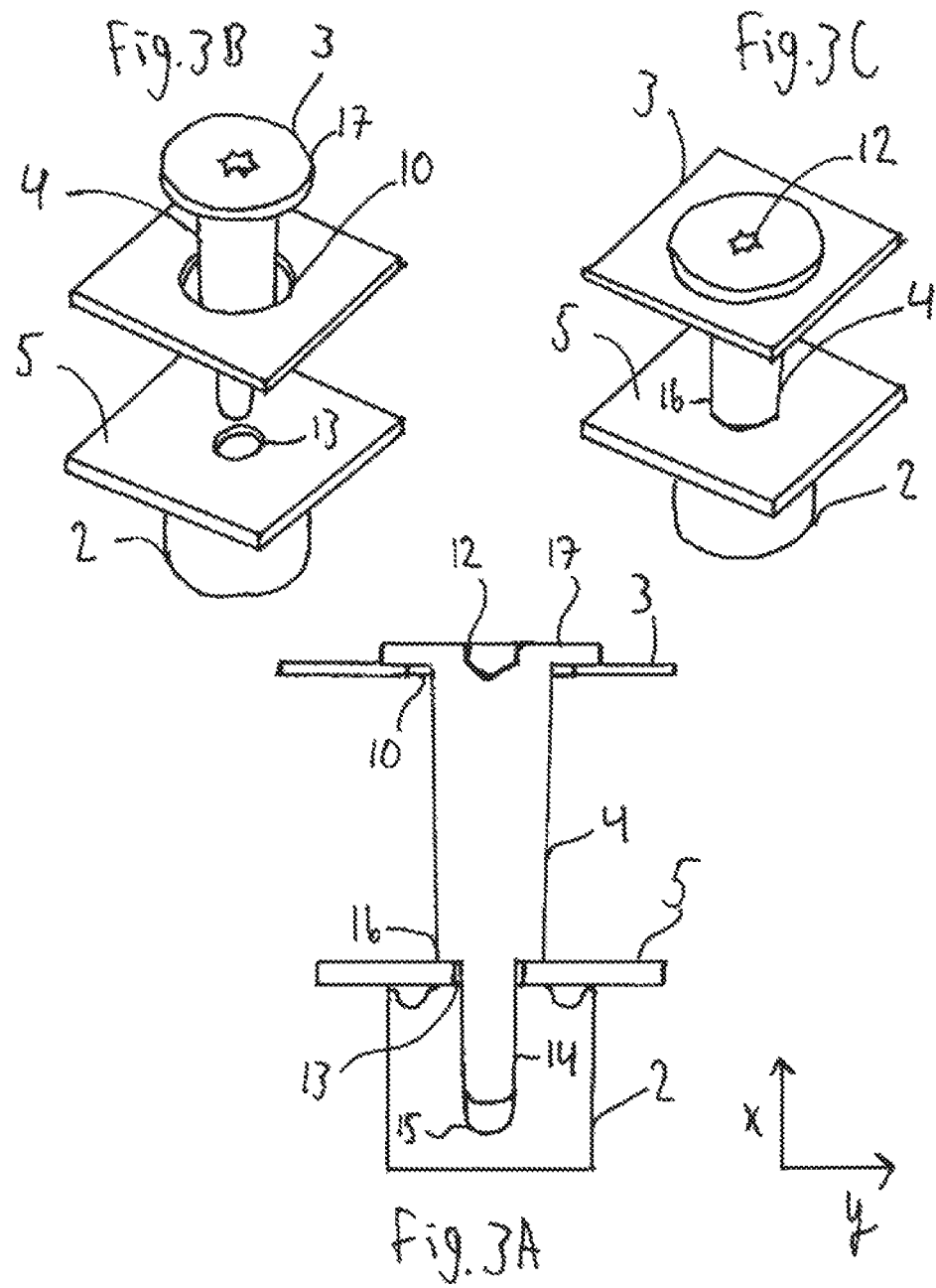

HOUSING FOR RECEIVING ELECTRICAL AND/OR ELECTRONIC COMPONENTS, ELECTRONIC CONTROL UNIT AND METHOD FOR PRODUCING SAME

BACKGROUND OF THE INVENTION

Field of the Invention

The invention concerns a housing for receiving electrical and/or electronic components, with a housing base part and a housing cover covering the housing base part. The housing cover is supported on the housing base part and/or fastened to the housing base part at least by means of a spacer bolt. The invention furthermore concerns a method for producing such a housing, an electronic control unit with the housing, and a method for producing the control unit.

Such housings are used for electrical and electronic components, in particular where electrical and electronic components must be protected from external influences and/or from contact with other function elements, or where other parts of the environment must be protected from the influence of elements inside the housing. In particular in the automotive industry, many types of housing are required for accommodating components and protecting these from the influence of moisture and fluids, from temperature changes and dirt. Such housings must have a long service life, close permanently and reliably under great temperature changes and mechanical loads, and be simple to produce.

It is known from the prior art to close a housing base part by means of a cover. Typically, a seal is arranged between the cover and the housing base part. For example, an engine control unit (ECU) may be accommodated in the housing. If the control unit and hence the housing is very large, the thermal and mechanical stresses in particular on the seal between the housing base part and housing cover increase.

Under certain circumstances, this may lead to damage or even to failure of the seal and hence to a loss of tightness of the housing.

SUMMARY OF THE INVENTION

The present application is based on the object of creating a housing with a housing cover which can be closed permanently and reliably with a seal, wherein in particular high requirements are imposed on the tightness and stability.

The object is achieved by a housing and a method with the features of the independent claims. Refinements of the housing, an electronic control unit with the housing, and the method are described in the respective dependent claims, in the description which follows and in the drawings.

According to one aspect of the invention, a housing is given which, for receiving electrical and/or electronic components, has a housing base part and a housing cover covering the housing base part. The housing cover may also be designated the housing lid. In particular, by means of the housing base part, the housing cover and at least one plug connector, an interior of the housing is formed. In this configuration, the housing base part, the housing cover and the plug connector(s) are configured and connected together such that they seal the interior of the housing fluid-tightly against the environment of the housing.

According to a further aspect of the invention, an electronic control unit is given. The electronic control unit is in particular an engine control unit. It comprises the housing and at least one circuit board arranged in the interior of the housing and equipped with electronic components.

According to a third aspect of the invention, a method is given for producing a housing with a housing base part and a housing cover for receiving electrical and/or electronic components.

The housing cover is supported on the housing base part and/or fastened to the housing base part at least by means of a spacer bolt. The housing cover has an opening and the spacer bolt is connected by substance bonding to an edge of this opening, so that the spacer bolt closes the opening. The term "edge of the opening" in the present context means in particular a rim of the housing cover surrounding the opening and preferably annular in form. The rim extends in particular laterally outwards from an outer contour of the opening. The opening is in particular a hole in the housing cover which, in top view onto a main face, penetrates the housing cover preferably in a central region. The spacer bolt closes the opening in particular fluid-tightly.

The connection between the spacer bolt and the housing cover is preferably configured fluid-tightly. This ensures that e.g. liquid or dirt in the region of said connection cannot penetrate into the interior of the housing. The housing cover is also supported on the housing base part by means of the spacer bolt. In this way, a deformation of the housing cover due to mechanical or thermal load can be reduced.

In one embodiment, the housing has a seal surrounding an edge of the housing cover, between the housing cover and the housing base part. In this way, the housing as a whole may be configured fluid-tightly. On production of the housing, a wet or paste-like sealing compound is applied preferably to the housing base part and/or to the housing cover. Then the housing base part is covered with the housing cover, whereupon the sealing compound may cure typically at room temperature into a preferred integral seal.

To avoid the sealing compound being displaced out of a sealing region between the housing cover and the housing base part before or during curing, due to positive or reduced pressure or pressure fluctuations, advantageously a pressure compensation between the interior of the housing and the environment may take place through the opening in the housing cover. Thus e.g. on curing of the sealing compound, gases may be produced which can now advantageously escape through the opening in the housing cover.

After the gases have escaped and the seal has been formed, the edge of the opening is connected by substance bonding to the spacer bolt. Thus it can be ensured that after and/or during production of the housing, the air pressure in the interior of the housing is approximately equal to ambient air pressure, and the housing is sealed fluid-tightly. This leads to a lower load on the seal between the housing base part and the housing cover.

In one embodiment, the opening—or a base form of the opening—has the form of a circular disc in top view. In a refinement, a diameter of the opening has a value of maximum 10 mm. The diameter of the opening may however also be smaller, e.g. 5 mm or less, as long as it is ensured that the gases can escape and/or the connection between the edge of the opening and the spacer bolt can be created reliably. Advantageously, with such values, a particularly high mechanical stability of the housing cover may be achieved.

Typically, the housing base part and the housing cover form a cavity for receiving the electrical and/or electronic components. The cavity is in particular the interior of the housing. A height of the cavity, measured perpendicularly from a floor of the housing base part up to the housing cover, and in particular up to an edge of the opening, in one embodiment is at least 5 mm and/or at most 15 mm. The spacer bolt, and hence the opening, is preferably arranged in a region of a maximum height of the cavity and/or in the region of the center of the area of the housing cover, in order to increase the stability.

In one embodiment, the housing cover is a plastic or metal cover. Preferably, the housing cover is made from a flexible material, e.g. of sheet metal. Pressure fluctuations caused e.g. by thermal fluctuations during operation of the electronic and electrical components, or by vibrations, may then be damped by the housing cover. By means of the housing cover supported by the spacer bolt, pressure differences of up to 1 bar between the interior of the housing and the environment may be compensated without the seal being damaged by this.

In one embodiment, a circuit board with a cutout is arranged in the housing. In this case, the spacer bolt preferably passes through the cutout in the circuit board. Preferably, the cutout in the circuit board is configured corresponding to a diameter of the spacer bolt. In this way, the circuit board may be fixed in the housing at least in one spatial direction.

In a refinement, the spacer bolt has a protrusion, in particular a lateral protrusion, which has a greater diameter than the cutout in the circuit board. For example, the protrusion is formed by a step in the outer contour of the spacer bolt. The protrusion is formed in particular on the housing base part side of the spacer bolt, i.e. in particular in the region of an end portion of the spacer bolt facing towards the housing base part. Preferably, the circuit board is clamped between the protrusion and the housing base part. This refinement ensures a further fixing of the circuit board inside the housing. This increases the mechanical stability, and the circuit board is better protected against vibrations and/or impacts.

In one embodiment, the spacer bolt is inserted in a blind hole of the housing base part. This may simplify mounting of the housing and further increase the stability of the housing. Said blind hole and the spacer bolt may be provided with an inner thread and an outer thread respectively, and the blind hole and the spacer bolt may be screwed together. Preferably, the cutout in the circuit board is aligned with the blind hole. In other words, the blind hole is arranged in the region of the cutout so that, in top view onto a main face of the circuit board, this is not covered underneath by said circuit board. In this embodiment, the circuit board can be clamped particularly firmly between the spacer bolt and the housing base part. The spacer bolt thus serves not only as a support for the housing cover but also as a fixing for the circuit board to the housing base part.

In one embodiment, the spacer bolt has a carrier profile configured for application of a tightening tool. This allows particularly simple installation. The carrier profile is configured in particular on an end of the spacer bolt facing away from the blind hole. It may for example be formed by a polygonal recess in the end facing away from the blind hole.

In a further embodiment, the spacer bolt has a second protrusion, in particular a lateral protrusion, which is connected by substance bonding to the edge of the opening. The second protrusion is in particular a protrusion on the housing cover side, i.e. in particular it is formed in the region of an end portion of the spacer bolt facing towards the housing cover. For example, the second protrusion may be formed by means of a peripheral collar on an end of the spacer bolt. Depending on design, the housing cover may rest on the second protrusion, or the second protrusion rests on the housing cover. The second protrusion allows a greater area of the housing cover to be supported on the spacer bolt. Also, by means of the second protrusion, the substance-bonded connection between the spacer bolt and the housing cover may be produced particularly easily.

In one embodiment, the spacer bolt comprises the end portion facing the housing base part ("first end portion"), the end portion facing the housing cover and opposite the first end portion ("second end portion"), and a middle region which joins the two end portions together. The first protrusion constitutes a transitional region from the first end portion to the middle region, in which the cross-section area enlarges towards the second end portion in the direction of a longitudinal axis of the spacer bolt. When the first protrusion is formed by a step, the enlargement takes place in particular in a step. The second protrusion constitutes a transitional region from the middle region to the second end portion, in which the cross-section area enlarges continuously or in a step towards the second end portion in the direction of the longitudinal axis.

The spacer bolt may be soldered, bonded or welded to the edge of the opening. Here the spacer bolt is preferably connected to the edge of the opening by means of laser welding or friction stir welding.

In a refinement, the spacer bolt has a depression which is arranged below the opening of the housing cover, wherein the depression and the opening are configured for receiving, at least partially, a friction stir welding tool. The depression may be formed by the carrier profile. The spacer bolt may also be electrically conductive so that it can form an electrical connection between the circuit board and the housing cover.

In one embodiment, the housing base part and the housing cover are attached to each other by means of flanging, screwing or crimping. A snap connection may also be created between the base part and the cover of the housing. In another embodiment, the base part and the cover are connected by means of clips. The seal between the housing base part and the housing cover is preferably configured cohesively and/or integrally.

In one embodiment, the method comprises the following steps: mounting of a spacer bolt on the housing base part, covering the housing base part by means of the housing cover, wherein the housing cover has an opening, and substance-bonded connection of an edge of the opening of the housing cover to the spacer bolt, wherein the spacer bolt closes the opening. Preferably, the edge of the opening of the housing cover is connected to the spacer bolt after the housing base part has been covered with the housing cover.

In one embodiment, the housing base part is covered with the housing cover following mounting of the spacer bolt on the housing base part. In an alternative embodiment, the spacer bolt is inserted into the interior of the housing through the opening of the housing cover. In this embodiment, the spacer bolt is preferably mounted on the housing base part following insertion of the spacer bolt through the opening, which in turn takes place preferably after the housing base part has been covered with the housing cover.

According to a refinement, the spacer bolt is welded, soldered or bonded to the edge of the opening. Preferably, the spacer bolt is connected to the housing cover by means of laser welding or friction stir welding. In one embodiment, on mounting, the spacer bolt is inserted in a blind hole of the housing base part, wherein the spacer bolt and the blind hole preferably have an outer thread and an inner thread respectively and are screwed together.

In one embodiment, a circuit board with a cutout is arranged on or over the housing base part, in particular such that after fitting of the housing cover, it is arranged in the interior of the housing. The spacer bolt is preferably guided through the cutout, in particular for mounting spacer bolt on the housing base part.

Preferably, the circuit board is arranged on the housing base part before the spacer bolt is mounted. Thus on mounting of the spacer bolt, at the same time the circuit board may be fixed to the housing base part. In a refinement, the spacer bolt has a protrusion which has a greater diameter than the cutout of the circuit board. In this case, the circuit board may be clamped between the protrusion of the spacer bolt and the housing base part.

If the spacer bolt has the depression described above, the method may comprise the further following steps: arrangement of the opening of the housing cover above the depression so that the depression is accessible from an outside of the housing, in particular through the opening, at least partial insertion of a rotating friction stir welding tool in the opening and in the depression, and friction stir welding of the housing cover to the spacer bolt.

In one embodiment, the housing base part and the housing cover are attached to each other by means of crimping or flanging. A seal may be arranged between an edge of the housing base part of the housing cover.

Features which have been described above in connection with the method are also suitable for the housing and the control unit, and vice versa.

To summarize, the invention may have the following advantages:

Due to the substance-bonded connection of the spacer bolt to the edge of the opening of the housing cover, the housing may be sealed fluid-tightly, rapidly and reliably in the region of the opening. During production of the housing, a pressure compensation may take place through the opening in the housing cover, whereby the sealing compound is not displaced from the sealing region. Also, gases which may be produced on curing of the seal between the housing cover and the housing base part may escape through the opening. Also, a rotating friction stir welding tool may be inserted through the opening in order to connect the spacer bolt to the edge of the opening. Furthermore, typically the spacer bolt increases the mechanical stability of the housing, whereby movements or vibrations of the housing cover may be prevented or reduced. The circuit board may be secured and fixed to the housing base part by means of the spacer bolt. Furthermore, the spacer bolt may form an electrical connection between the circuit board and the housing cover.

Further advantages and advantageous embodiments and refinements of the housing, control unit and method arise from the following exemplary embodiments, depicted in connection with the diagrammatic figures.

DESCRIPTION OF THE INVENTION

Figure 1A:
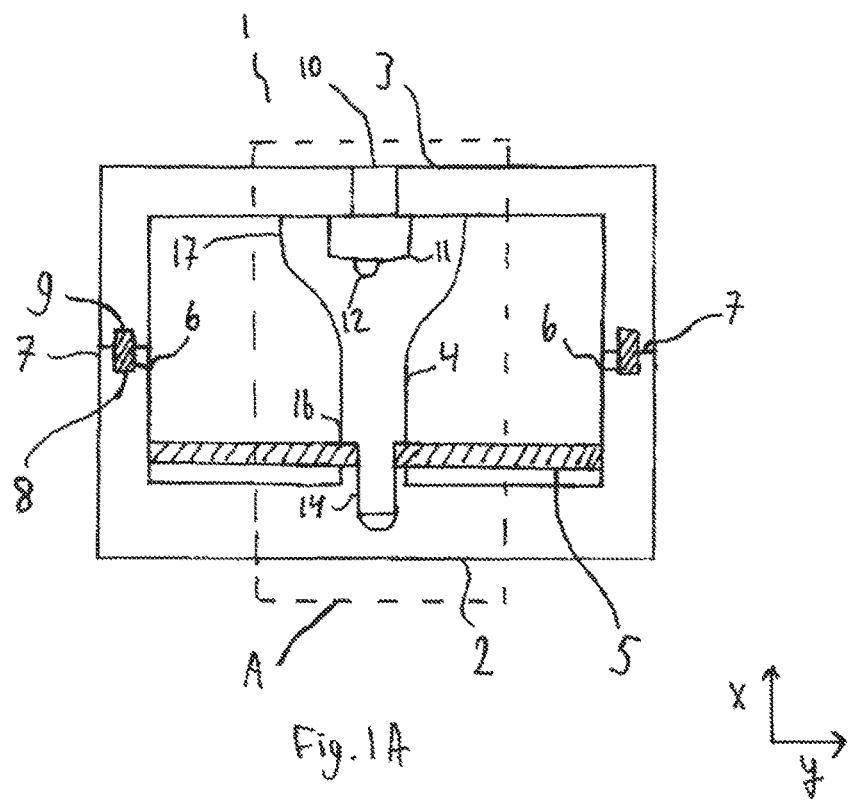
FIG. 1A a diagrammatic section view of a housing with a housing base part and a housing cover according to a first exemplary embodiment, FIG. 1B a diagrammatic section view of a housing with a housing base part and a housing cover according to a second exemplary embodiment, FIG. 2A detail A from FIG. 1A, FIG. 2B an exploded, perspective depiction of the housing parts from FIG. 2A, FIG. 2C a perspective view of detail A in FIG. 1A, FIG. 3A detail B from FIG. 1B, FIG. 3B an exploded, perspective depiction of the housing parts from FIG. 3A, and FIG. 3C a perspective view of detail B from FIG. 1B.

The same or similar elements, or those with the same function, carry the same reference numerals in the figures. In many figures, individual reference numerals may be omitted to improve clarity. The figures and the size ratios of the elements shown in the figures should not be regarded as being to scale. Rather, individual elements may be depicted exaggeratedly large for better clarity and/or for better understanding.

Figure 1B:
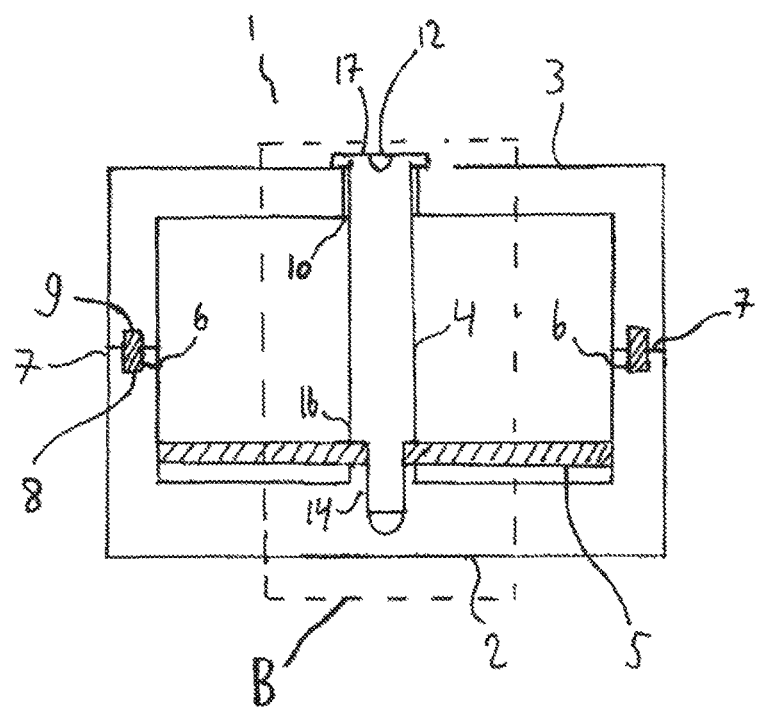

FIG. 1A and FIG. 1B each show a section of a housing 1 with a housing base part 2 and a housing cover 3 according to a first and a second exemplary embodiment respectively.

The housing base part 2 has side walls which have a peripheral edge 7. A peripheral sealing face 8 formed as a groove is provided in the edge 7 of the housing base part 2, and a cohesive, preferably integral seal 6 is arranged therein. The housing cover 3 also has a peripheral edge in which a sealing face 9, configured as a groove, is provided. Instead of the groove-like form, the sealing faces 8 and 9 may also have other forms. The seal 6 is arranged at least in places between the groove 8 and the groove 9, and thus seals the housing 1 at the edge 7, more precisely at the border region of the mutually facing and in particular touching edges of the housing base part 2 and housing cover 3.

Suitably, the housing 1 has a plug connector (not shown in the figures) which in places is arranged between the housing base part 2 and the housing cover 3. The plug connector, in particular together with the housing base part 2 and the housing cover 3, defines an interior of the housing 1. Portions of the seal 6 are suitably arranged between the housing base part 2 and the plug connector, and between the housing cover 3 and the plug connector, in particular in order to seal the housing completely on the periphery, i.e. along the edge 7 of the housing base part 2 and along the edge of the housing 3.

A plurality of electrical and electronic components is arranged in the housing 1. In the example shown, a circuit board 5 may be seen which is arranged on the housing base part 2. The housing cover 3 is supported in the center of the housing 1 by a spacer bolt 4 on the housing base part 2, and is fastened to the housing base part 2 by means of the spacer bolt 4. Furthermore, in the region of the edge 7, the housing base part 2 is fastened to the housing cover 3 by means of flanging or crimping (not shown).

A blind hole bore 14 with an inner thread is located in the housing base part 2. The spacer bolt 4 has an outer thread which is screwed to the inner thread of the blind hole bore 14. At an end of the blind hole bore 14 opposite the housing cover 3, a base hole 15 may be seen. Furthermore, the spacer bolt 4 passes through a cutout 13 which is formed in the circuit board 5 and aligned with the blind hole bore 14. Above the cutout 13 of the circuit board 5, i.e. on the side of the circuit board 5 facing away from the blind hole bore 14, the spacer bolt 4 has a first protrusion 16 which has a greater diameter than the cutout 13. The protrusion 16 formed by a step in the spacer bolt 4 lies on the circuit board 5, in particular by force fit and/or form fit. Thus the circuit board 5 is clamped between the first protrusion 16 of the spacer bolt 4 and the housing base part 2.

The housing cover 3 also has an opening 10, configured as a circular through hole with a diameter of 5 mm. The edge of the opening 10, i.e. a rim of the housing cover 3 surrounding the opening 10, is connected to a second protrusion 17 of the spacer bolt 4 by substance bonding via a weld connection. The weld connection may e.g. be a laser weld connection or a friction stir weld connection.

The spacer bolt 4 closes the opening 10 completely. In other words, by means of the spacer bolt 4 welded to the housing cover 10, a penetration of gases or liquids through the opening 10 into the interior of the housing 1 is prevented. The housing 1 is in particular configured fluid-tightly and thus protected from dirt and penetrating fluids.

Figure 2A:
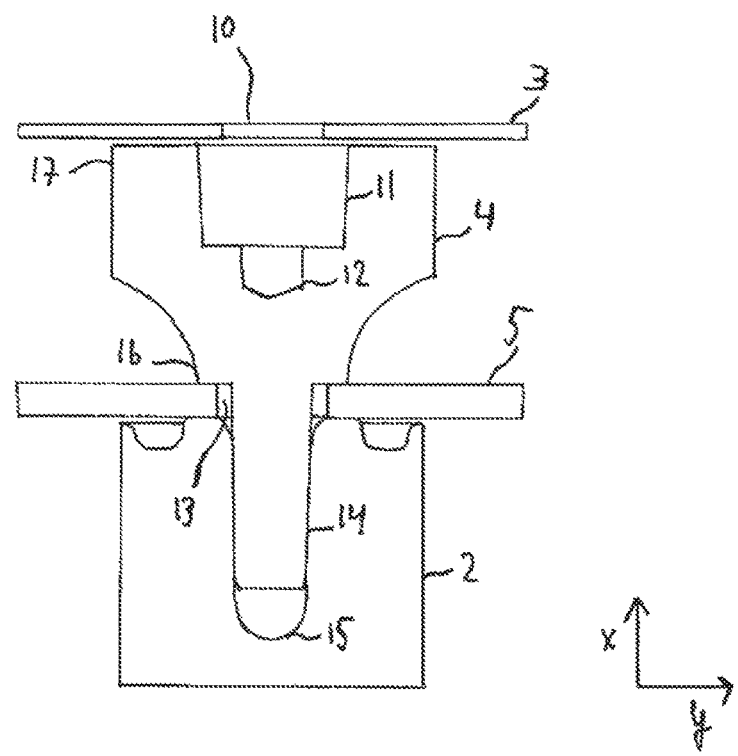
Figure 2B:
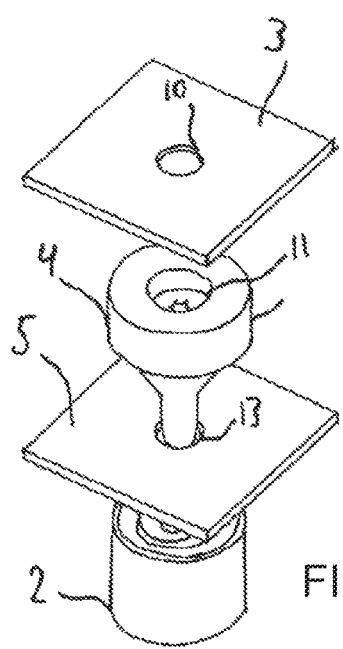
Figure 2C:
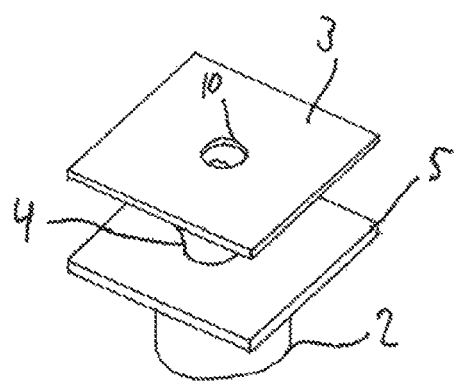

FIGS. 2A-2C show detail A from FIG. 1A in different views. As can be seen from these figures, the spacer bolt 4 has a depression 11. This is located below the opening 10 of the housing cover 3 so that it is accessible from the outside through the opening 10. The depression 11 and the opening 10 in the example shown are configured to receive a friction stir welding tool. The edge of the opening 10 and the spacer bolt 4 may thus in particular be connected together by means of friction stir welding. At the base of the depression 11 is a carrier profile 12 formed for application of a tightening tool. The rim of the housing cover 3 lies on the second protrusion 17 of the spacer bolt 4.

FIGS. 3A-3C show detail B from FIG. 1B in different views. The arrangement of FIGS. 1B and 3A-3C differs from the arrangement of FIGS. 1A and 2A-2C substantially in that the second protrusion 17 of the spacer bolt 4 lies on the outside on the housing cover 3, and no depression 11 is provided in the spacer bolt 4 for a friction stir welding tool. The end of the spacer bolt 4 opposite the blind hole 14 has merely a recess which forms a carrier profile 12 for application of a tightening tool.

The protrusion 17 resting on the outside is particularly easily accessible for creation of a laser welding connection. The second protrusion 17 in this case is therefore preferably connected to the edge of the opening 10 via a laser weld seam.

A method is described below for production of a housing 1.

Firstly, the mounting of the housing 1 according to the first exemplary embodiment will be explained with reference to FIGS. 2B and 2C.

Firstly, the circuit board 5 with the cutout 13 is mounted on the housing base part 2 such that the cutout 13 is aligned with the blind hole bore 14, so that the latter is exposed. The spacer bolt 4 is guided through the cutout 13 of the circuit board 5. By means of a screwdriver and the carrier profile 12, the outer thread of the spacer bolt 4 is screwed to the inner thread of the blind hole bore 14. In this way, the circuit board 5 is clamped between the first protrusion 16 of the spacer bolt 4 and the housing base part 2, and fixed in at least two spatial directions x and y in FIG. 1A.

Then a sealing compound 6 is introduced into at least one of the grooves 8 and 9, and the housing cover 3 is mounted on the edge 7 of the housing base part 2. The housing cover 3 is attached to the housing base part 2 by means of flanging, in addition to bonding with the sealing compound.

Between the housing cover 3 and the second protrusion 17 of the spacer bolt 4, a gap of around 1 mm is created in the x direction—i.e. in particular in the direction of a longitudinal axis of the spacer bolt 4. On production of the housing 1, a pressure compensation between the interior of the housing 1 and the environment may take place through the gap and the opening 10. Gases released on curing of the sealing compound may thus escape from the housing 1 through the gap and the opening 10 in the housing cover 3. When the sealing compound has cured into a seal 6, a rotating friction stir welding tool is inserted in the opening 10 and the depression 11. Suitably, at the same time, the housing cover 3 is pressed onto the spacer bolt in the longitudinal direction, during forming by means of the friction stir welding tool.

The edge of the opening 10 is in this way welded to the spacer bolt 4, in particular in that the rim of the housing cover 3 and the end of the spacer bolt 4 facing the housing cover 3 are heated by friction with the friction stir welding tool. The heating, in particular to just below the melting point, in particular causes a loss of strength of the material of the housing cover 3 or spacer bolt 4, whereby the material is plasticized and a mixing is achieved in the region of the rim.

Instead of welding, the edge of the opening 10 may also be bonded or soldered to the second protrusion 17 of the spacer bolt 4. Solder material or bonding compound may be introduced for example into the depression 11. However, the depression 11 may also be omitted.

Production of the housing 1 according to the second exemplary embodiment differs from the mounting of the housing 1 according to the first exemplary embodiment, amongst others in the order of the production steps. Firstly, the circuit board 5 is mounted on the floor of the housing base part 2 such that the cutout 13 of the circuit board 5 is placed above the blind hole bore 14 of the housing base part 2. The circuit board 5 may for example be provisionally attached to the housing base part 2 with a layer of adhesive or a layer of heat-conductive paste (not shown in the figures).

Also, in particular afterwards, a paste-like wet sealing compound is applied to the grooves 8 and 9, whereupon the housing cover 3 is mounted on the housing base part 2 and, in a refinement, attached to this by means of flanging. Only when the sealing compound has cured to a solid seal 6, and hence no more gases escape from the sealing compound, is the spacer bolt 4 guided through the opening 10 of the housing cover 3 and the cutout 13 of the circuit board 5 into the blind hole bore 14, wherein the outer thread of the spacer bolt 4 is screwed to the inner thread of the blind hole bore 14.

The circuit board 5 is here clamped between the first protrusion 16 and the housing base part 2, and fixed in at least two spatial directions x and y. The second protrusion 17 of the spacer bolt 4 is then connected by substance bonding to the edge of the opening 10, on the outside of the housing 1 facing away from the interior, for example by laser welding, friction stir welding, soldering or bonding.

The invention claimed is:

1. A housing for receiving at least one of electrical or electronic components, the housing comprising:
   a housing base part;
   a spacer bolt; and
   a housing cover covering said housing base part, said housing cover being at least one of supported on said housing base part or fastened to said housing base part at least by said spacer bolt, and said housing cover having an opening formed therein defining an edge of said opening;
   said spacer bolt being connected by substance bonding to said edge of said opening causing said spacer bolt to close said opening;
   said spacer bolt having a depression formed therein, said depression being below said opening in said housing cover; and
   said depression and said opening being configured for at least partially receiving a friction stir welding tool.

2. The housing according to claim 1, wherein said spacer bolt has a side facing said housing cover, said spacer bolt has a protrusion on said side facing said housing cover, and said protrusion is connected by substance bonding to said edge of said opening.

3. The housing according to claim 1, wherein said spacer bolt is inserted into a blind hole formed in said housing base part.

4. The housing according to claim 3, wherein said blind hole has an inner thread, said spacer bolt has an outer thread, and said spacer bolt is screwed into said blind hole.

5. The housing according to claim 4, wherein said spacer bolt has a carrier profile configured for application of a tightening tool.

6. The housing according to claim 1, which further comprises a weld connection formed between said spacer bolt and said edge of said opening.

7. The housing according to claim 1, which further comprises a seal running around an edge of said housing cover between said housing cover and said housing base part.

8. An electronic control unit, comprising:
a housing including a housing base part, a spacer bolt, and a housing cover covering said housing base part; and
a circuit board disposed in said housing, said circuit board having a cutout formed therein;
said spacer bolt passing through said cutout in said circuit board;
said housing cover being at least one of supported on said housing base part or fastened to said housing base part at least by said spacer bolt, and said housing cover having an opening formed therein defining an edge of said opening;
said spacer bolt being connected by substance bonding to said edge of said opening causing said spacer bolt to close said opening;
said spacer bolt having a side with a protrusion facing said housing base part, said protrusion having a greater diameter than said cutout in said circuit board; and
said circuit board being clamped between said protrusion and said housing base part.

9. A method for producing a housing for receiving at least one of electrical or electronic components, the method comprising the following steps:
providing a housing base part;
providing a housing cover having an opening formed therein defining an edge of the opening;
mounting a spacer bolt on the housing base part; providing a depression in the spacer bolt;
applying a paste-like sealing compound to at least one component selected from the group consisting of the housing base part and the housing cover;
covering the housing base part with the housing cover; placing the opening in the housing cover above the depression;
curing the paste-like sealing compound to form an integral seal between the housing base part and the housing cover;
at least partially inserting a rotating friction stir welding tool in the opening and in the depression; and friction stir welding the housing cover to the spacer bolt; and substance-bonding the edge of the opening in the housing cover to the spacer bolt causing the spacer bolt to close the opening.

10. The method according to claim 9, which further comprises inserting the spacer bolt into a blind hole formed in the housing base part.

11. The method according to claim 9, which further comprises providing the spacer bolt with an outer thread, providing the blind hole with an inner thread, and screwing the threads of the spacer bolt and the blind hole together.

12. A method for producing an electronic control unit having at least one of electrical or electronic components, the method comprising the following steps:
providing a housing base part;
providing a circuit board having a cutout formed therein;
placing the circuit board on the housing base part;
inserting a spacer bolt through the cutout in the circuit board;
providing a protrusion on a side of the spacer bolt facing the housing base part, providing the protrusion with a greater diameter than the cutout in the circuit board, and clamping the circuit board between the protrusion and the housing base part upon mounting the spacer bolt on the housing base part;
providing a housing cover having an opening formed therein defining an edge of the opening;
covering the housing base part with the housing cover; and
substance-bonding the edge of the opening in the housing cover to the spacer bolt causing the spacer bolt to close the opening.

13. The method according to claim 12, which further comprises carrying out the steps of inserting and mounting the spacer bolt before the steps of covering the housing base part with the housing cover and substance-bonding the edge of the opening in the housing cover to the spacer bolt.

14. The method according to claim 12, which further comprises carrying out the steps of covering the housing base part with the housing cover before the steps of inserting the spacer bolt through the cutout in the circuit board, mounting the spacer bolt on the housing base part and substance-bonding the edge of the opening in the housing cover to the spacer bolt.

* * * * *